(12) United States Patent
Oh et al.

(10) Patent No.: US 12,087,848 B2
(45) Date of Patent: Sep. 10, 2024

(54) POWER SEMICONDUCTOR DEVICE WITH REDUCED LOSS AND MANUFACTURING METHOD THE SAME

(71) Applicant: TRinno Technology Co., Ltd., Seoul (KR)

(72) Inventors: Kwang Hoon Oh, Seoul (KR); Soo Seong Kim, Seoul (KR); Jin Young Jung, Seoul (KR); Chongman Yun, Seoul (KR)

(73) Assignee: TRINNO TECHNOLOGY CO., LTD., Seoul (KR)

( * ) Notice: Subject to any disclaimer, the term of this patent is extended or adjusted under 35 U.S.C. 154(b) by 0 days.

(21) Appl. No.: 17/872,212

(22) Filed: Jul. 25, 2022

(65) Prior Publication Data

US 2023/0317837 A1    Oct. 5, 2023

(30) Foreign Application Priority Data

Mar. 30, 2022  (KR) .................. 10-2022-0039837

(51) Int. Cl.
*H01L 29/739* (2006.01)
*H01L 29/66* (2006.01)

(52) U.S. Cl.
CPC .... *H01L 29/7392* (2013.01); *H01L 29/66356* (2013.01)

(58) Field of Classification Search
CPC ............. H01L 29/7392; H01L 29/7393; H01L 29/7395; H01L 29/7397; H01L 29/66068; H01L 29/66325; H01L 29/66333; H01L 29/66348; H01L 29/6634; H01L 29/66356; H01L 29/66431; H01L 29/66462; H01L 29/66893–66924; H01L 29/7811; H01L 29/7813; H01L 29/7832; H01L 29/7375; H01L 29/8086; H01L 29/1004; H01L 29/41708; H01L 29/42304; H01L 29/1608; H01L 29/1058; H01L 29/1066; H01L 29/1095; H01L 29/0696; H01L 29/0804–0834; H01L 29/167; H01L 29/4236; H01L 29/42376; H01L 29/0615; H01L 29/0634; H01L 29/0653; H01L 29/407; H01L 27/1469; H01L 27/098; H01L 21/0465; H01L 21/7602; H01L 21/761
USPC ......................................... 257/135, 139, 607
See application file for complete search history.

(56) References Cited

U.S. PATENT DOCUMENTS

| | | | | |
|---|---|---|---|---|
| 11,233,157 B2* | 1/2022 | Arthur | ............. | H01L 29/66893 |
| 2012/0292742 A1* | 11/2012 | Itoh | ..................... | H01L 29/7395 |
| | | | | 257/E29.005 |
| 2013/0092978 A1* | 4/2013 | Sugawara | ........... | H01L 29/0834 |
| | | | | 257/E29.197 |

(Continued)

FOREIGN PATENT DOCUMENTS

KR     1021636650000     10/2020

*Primary Examiner* — Natalia A Gondarenko
(74) *Attorney, Agent, or Firm* — Grossman, Tucker, Perreault & Pfleger, PLLC; Donald J. Perreault (57) ABSTRACT

Power semiconductor device with reduced loss and manufacturing method the same disclosed. Power semiconductor device include a first drift region of a first conductivity type, a second drift region of the first conductivity type formed by epitaxially growing on the first drift region and a plurality of buried ion regions of a second conductivity type formed to be buried in the second drift region.

7 Claims, 9 Drawing Sheets

(56) References Cited

U.S. PATENT DOCUMENTS

| | | | | |
|---|---|---|---|---|
| 2016/0284824 A1* | 9/2016 | Nagata | ............... | H01L 23/535 |
| 2018/0261666 A1 | 9/2018 | Zeng et al. | | |
| 2018/0286943 A1* | 10/2018 | Naito | ............... | H01L 29/4236 |
| 2018/0342587 A1 | 11/2018 | Okumura | | |
| 2019/0109218 A1* | 4/2019 | Corvasce | ............ | H01L 29/0619 |
| 2019/0181261 A1* | 6/2019 | Okumura | .......... | H01L 29/66734 |
| 2022/0399438 A1* | 12/2022 | Hoshi | ............. | H01L 21/0465 |

\* cited by examiner

POWER SEMICONDUCTOR DEVICE WITH REDUCED LOSS AND MANUFACTURING METHOD THE SAME

FIELD

The present invention relates to power semiconductor with reduced loss and method of manufacturing the same.

RELATED ARTS

Power semiconductor devices such as IGBT (Insulated Gate Bipolar Transistor), and MOSFET (Metal-Oxide Semiconductor Field Effect Transistor) have been developed and used in various applications.

Figure 1:
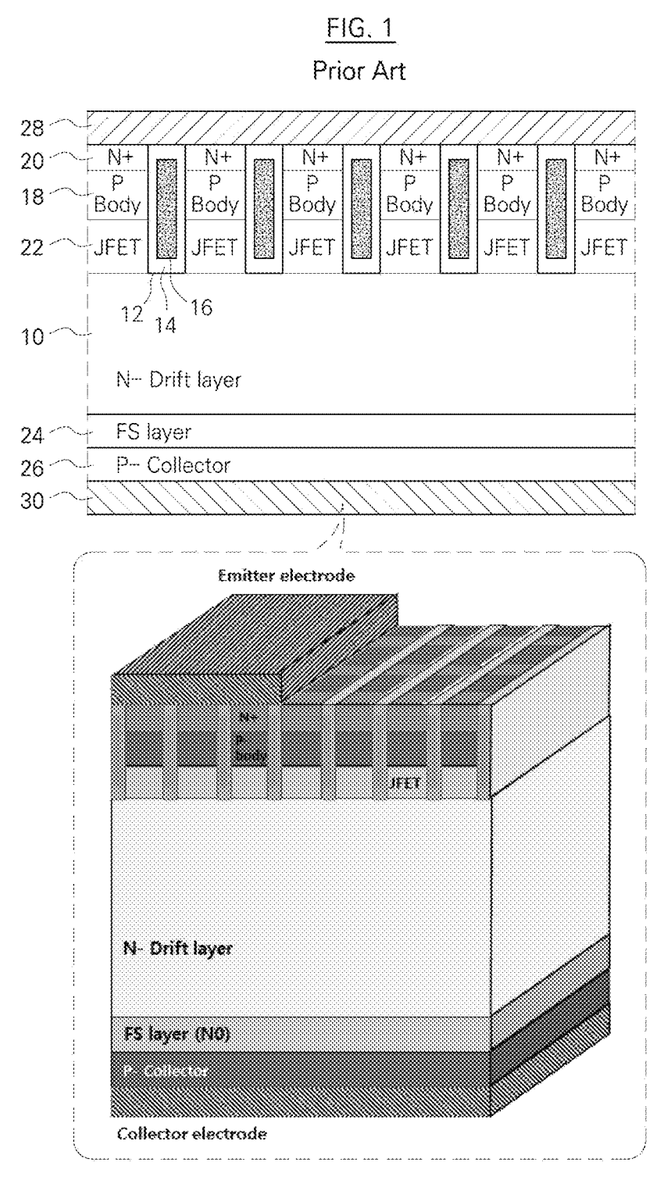
FIG. 1 illustrates a trench gate IGBT having a stripe patterned active cell according to the prior art.

FIG. 1 illustrates a trench gate IGBT having a stripe patterned active cell according to the prior art.

Referring to FIG. 1, the trench gate IGBT includes an N− drift region 10, a gate trench 12, a gate insulating layer 14, a gate electrode 16, and a P− body region 18, an N+ emitter region 20, an N JFET region 22, a field stop region 24, a P− collector region 26, an emitter electrode 28, and a collector electrode 30.

The gate trench 12 is formed to a predetermined depth into the drift region 10 and the gate insulating layer 14 is formed on the inner wall of the gate trench 12. The gate electrode 16 is buried in the gate trench 12 so as to be insulated by the gate insulating layer 14 from the body region 18, the emitter region 20, and the like.

In the region between the two gate trenches 12 arranged side by side, the JFET region 22 is formed on the drift region 10 while being in contact with the side wall of the gate trenches 12, the body region 18 is formed on the JFET region 22, and the emitter region 20 is formed on the body region 18 while being in contact with the side wall of the gate trenches 12.

Figure 2:
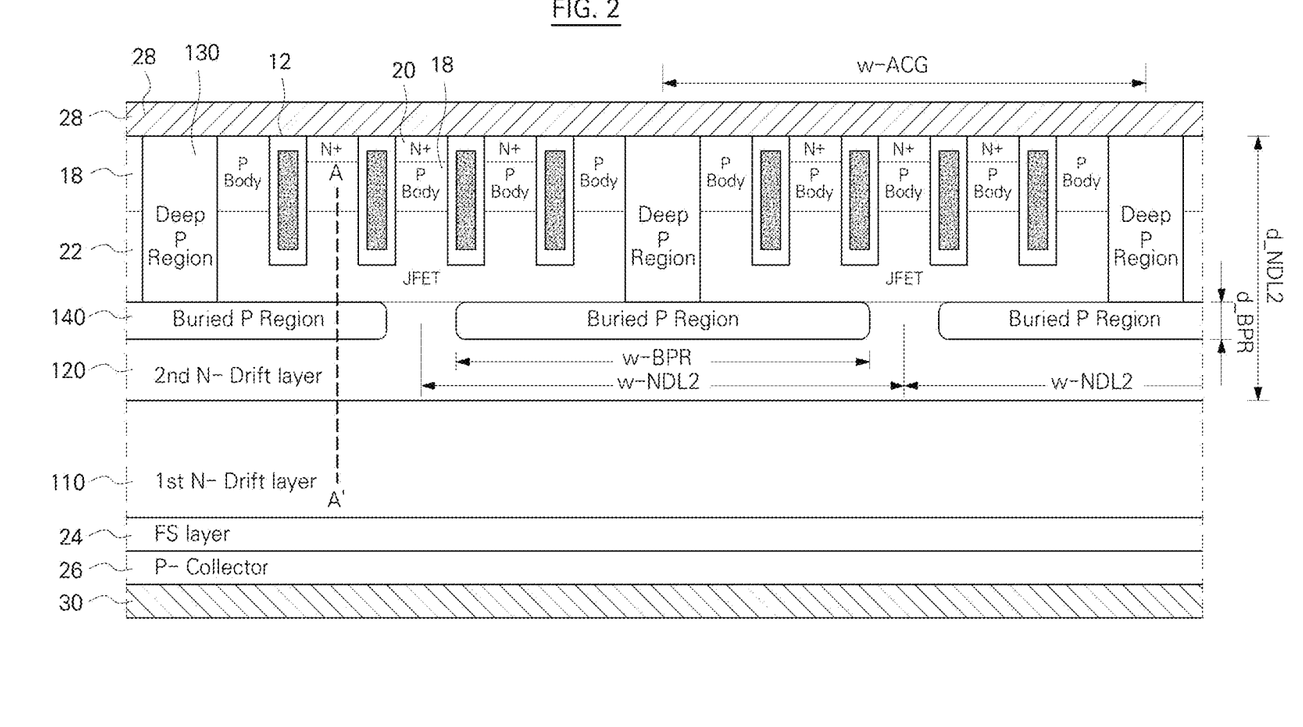
FIG. 2 exemplarily illustrates a cross-sectional view of a trench gate IGBT having a stripe patterned active cell according to one embodiment of the present invention.

Although the case in which the emitter region 20 is formed in all regions between the gate trenches 12 is illustrated in FIG. 2, it will be easily understood that the active cell in which the emitter region 20 is formed between the gate trenches 12 and the inactive cells in which the emitter regions 20 is not formed between the gate trenches 12 may be alternately arranged.

Since the IGBT has a current conduction mechanism of a bipolar transistor, there is a trade-off relationship in a conduction loss and a switching loss. That means, if the conduction loss is reduced by sufficient injection of minority carrier holes during current conduction, the switching loss is increased by the amount of an increased tail current corresponding to increase in holes during the switching-off.

In addition, a rapid change in dV/dt during switching on/off may induce a switching noise, an oscillation, and the like, thereby impairing reliable operation of the device. Therefore, in order for a power semiconductor device such as an IGBT to be effectively utilized in various industrial fields, it is necessary to improve not only a high breakdown voltage, but also a low conduction loss, a low switching loss, and a stable dV/dt slope.

The above-mentioned related art is technical information possessed by the inventor for derivation of the present invention or acquired in the derivation process of the present invention, and cannot necessarily be said to be a known technique disclosed to the general public prior to the filing of the present invention.

SUMMARY

The present invention is for providing a power semiconductor device capable of reducing conduction loss by maximizing a carrier stored effect of IGBT, and a method of manufacturing the same.

The present invention is for providing a power semiconductor device capable of improving the dV/dt slope during the switching-on/off, reducing the switching loss by easily expanding a depletion layer when a reverse voltage is applied, and improving the trade-off characteristics between the conduction loss and the switching loss, and a method of manufacturing the same.

For this purpose, a buried P region may be introduced to suppress a reduction of breakdown voltage due to the maximization of carrier stored effect, and a drift region having a higher concentration than the conventional structure may be formed in order to suppress an increase in conduction loss due to an introduction of the buried P region.

The drift region formed at the higher concentration than the conventional structure by the principle of charge balance with the buried P region may be advantageous of securing a lower conduction loss characteristic than the conventional structure while having the same breakdown voltage.

Other objectives of the present invention will be easily understood through the following description.

According to one aspect of the present invention, there is provided a power semiconductor device, including a first drift region of a first conductivity type, a second drift region of the first conductivity type formed by epitaxially growing on the first drift region and a plurality of buried ion regions of a second conductivity type formed to be buried in the second drift region, wherein the buried ion region may be formed with a predetermined extension length in a lateral direction, and disposed to be spaced apart from the adjacent buried ion region in the lateral direction by a predetermined separation value. The second drift region may be epitaxially grown with a relatively high ion concentration compared to the first drift region as much as the amount of increased ions of the second conductivity type by the plurality of buried ion regions.

In one embodiment, the power semiconductor device may further include a plurality of deep ion regions of the second conductivity type, extending from an upper surface of the second drift region to be in contact with the buried ion region and being spaced apart from each other by a predetermined width of active cell group in the lateral direction, a plurality of gate trenches being spaced apart from each other between adjacent deep ion regions and being formed from the upper surface of the second drift region to a depth not in contact with the buried ion region, a body region of the second conductivity type being formed in a region between adjacent gate trenches and a region between the trench gate and the deep ion region and an emitter region of the first conductivity type being formed on the body region to be in contact with facing walls of adjacent gate trenches.

In one embodiment, an ion implantation dose of the second conductivity for forming the buried ion region, the deep ion region and the body region may be in a range of 1e13 cm$^{-2}$ to 1e14/cm$^{-2}$.

In one embodiment, the power semiconductor device may further include a JFET region of the first conductivity being formed in a region between the body region and the buried ion region, wherein the JFET region is formed to have a higher ion concentration than that of the second drift region.

In one embodiment, the ion concentration of the second drift region may be determined to be relatively higher than the ion concentration of the first drift region by the following Equation:

$$(Nd2-Nd1) \times w\_NDL2 \times d\_NDL2 = Na \times w\text{-}BPR \times d\_BPR$$

wherein Nd2 is the ion concentration of the second drift region, Nd1 is the ion concentration of the first drift region, w_NDL2 is equal to the predetermined width of the active cell group width w-ACG, d_NDL2 is a thickness of the second drift region, Na is an ion concentration of the buried ion region, w-BPR is the extension length of the buried ion region, and d_BPR is a thickness of the buried ion region.

In one embodiment, the separation value between each buried ion region may be determined as any value between 25% and 75% of the predetermined width of active cell group width.

Alternatively, the separation value of the buried ion regions may be determined as a value representing the smallest conduction loss value in a curve of showing change of the conduction loss value according to a change in the separation value.

According to one aspect of the present invention, there is provided a method of manufacturing a power semiconductor device, including epitaxially growing a portion of a second drift region of a first conductivity type to a predetermined thickness on a first drift region of the first conductivity type, implanting ions of a second conductivity type into a portion of the second drift region designated to form a plurality of buried ion regions, and epitaxially growing a remaining portion of the second drift region to form the second drift region in which the plurality of buried ion regions is formed, wherein the buried ion region may be formed with a predetermined extension length in a lateral direction, and disposed to be spaced apart from the adjacent buried ion region in the lateral direction by a predetermined separation value, wherein the ion concentration of the second drift region may be determined to be relatively higher than the ion concentration of the first drift region by the following Equation:

$$(Nd2-Nd1) \times w\_NDL2 \times d\_NDL2 = Na \times w\text{-}BPR \times d\_BPR$$

wherein Nd2 is the ion concentration of the second drift region, Nd1 is the ion concentration of the first drift region, w_NDL2 is equal to the predetermined width of the active cell group width w-ACG, d_NDL2 is a thickness of the second drift region, Na is an ion concentration of the buried ion region, w-BPR is the extension length of the buried ion region, and d_BPR is a thickness of the buried ion region.

In one embodiment, the separation value of the buried ion regions is determined as a value representing the smallest conduction loss value in a curve of showing change of the conduction loss value according to a change in the separation value.

Aspects, features, advantages other than above described will be apparent from the following drawings, claims and detailed description.

According to embodiments of the present invention, it may be advantageous that the dV/dt slope during the switching on/off can be improved, the switching loss can be reduced by easily expanding a depletion layer when a reverse voltage is applied, and the trade-off characteristics between the conduction loss and the switching loss can be improved.

To this end, the buried P region may be introduced to suppress the breakdown voltage decrease due to the maximization of carrier stored effect and the drift region having the higher concentration than the conventional structure may be formed in order to suppress an increase in conduction loss due to the buried P region.

The drift region formed at the higher concentration than the conventional structure by the principle of charge balance with the buried P region may be advantageous of securing a lower conduction loss characteristic than the conventional structure while having the same breakdown voltage.

In addition, it may be advantageous that the conduction loss can be reduced by maximizing a carrier stored effect of IGBT. It may be also advantageous that due to the principle of charge balance, the depletion layer expands even at a low reverse voltage during switching off and as a result, the tail current becomes reduced, thereby improving the switching-off characteristics.

The effects obtainable in the present invention may not be limited to the above-mentioned effects, and other effects not mentioned may be clearly understood by those of ordinary skill in the art to which the present invention belongs from the following description.

DESCRIPTION OF EMBODIMENTS

The invention can be modified in various forms and specific embodiments will be described and shown below. However, the embodiments are not intended to limit the invention, but it should be understood that the invention includes all the modifications, equivalents, and replacements belonging to the concept and the technical scope of the invention. In describing the present invention, if it is determined that a detailed description of a related known technology may obscure the gist of the present invention, the detailed description thereof will be omitted.

Terms such as first, second, etc., may be used to refer to various elements, but, these element should not be limited due to these terms. These terms will be used to distinguish one element from another element.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Relative terms, such as "below" or "above" or "upper" or "lower" or "horizontal" or "lateral" or "vertical" may be used herein to describe-one element, layer or region's relationship to another elements, layers or regions as illustrated in the Figures. It will be understood that relative terms are intended to encompass different orientations of the device in addition to the orientation depicted in the Figures.

In the specification, P− or P0 conductivity type may be referred as P conductivity type and N− or N0 conductivity type may be referred as N conductivity type.

Hereinafter, an embodiment of the present invention will be described in detail with reference to the accompanying drawings. However, in the following description, the insulated-gate bipolar transistor (IGBT) will be mainly described, but it should be understood that the technical concept of the present invention may be applied and expanded to various types of semiconductor devices such as power MOSFETs in the same or similar manner.

Figure 3A:
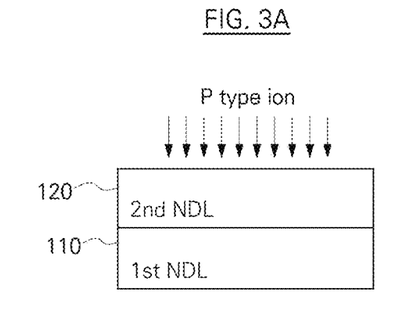
FIG. 3A through 3F exemplarily illustrate a method of manufacturing the trench gate IGBT according to one embodiment of the present invention.
Figure 3B:
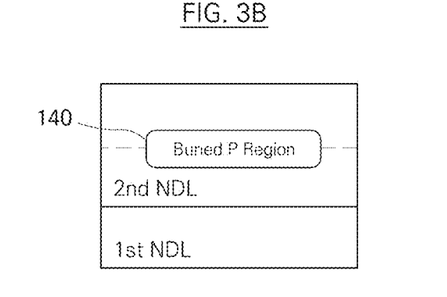
Figure 3C:
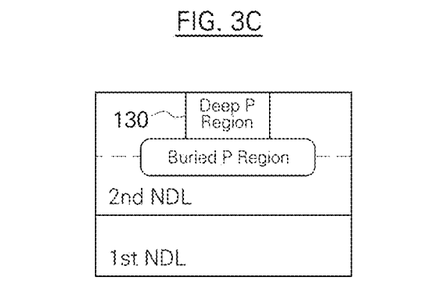
Figure 3D:
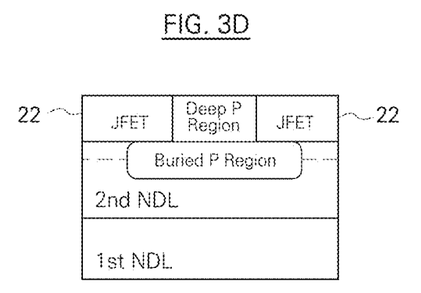
Figure 3E:
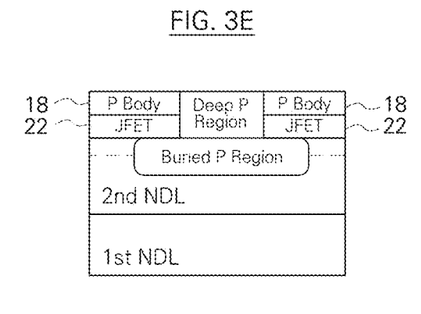
Figure 3F:
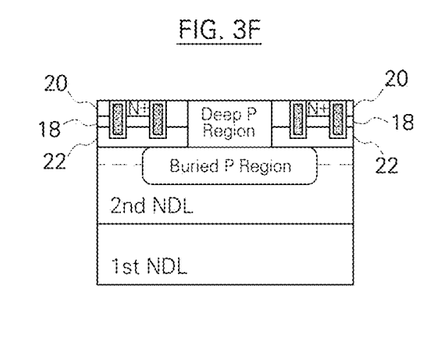
Figure 4:
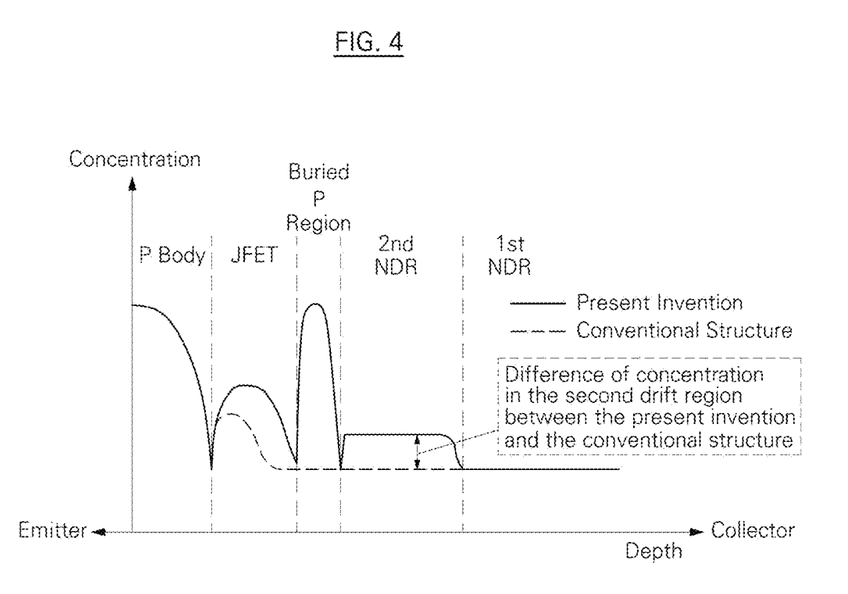
FIG. 4 is a diagram illustrating a vertical concentration profile of the trench gate IGBT according to one embodiment of the present invention.
Figure 5:
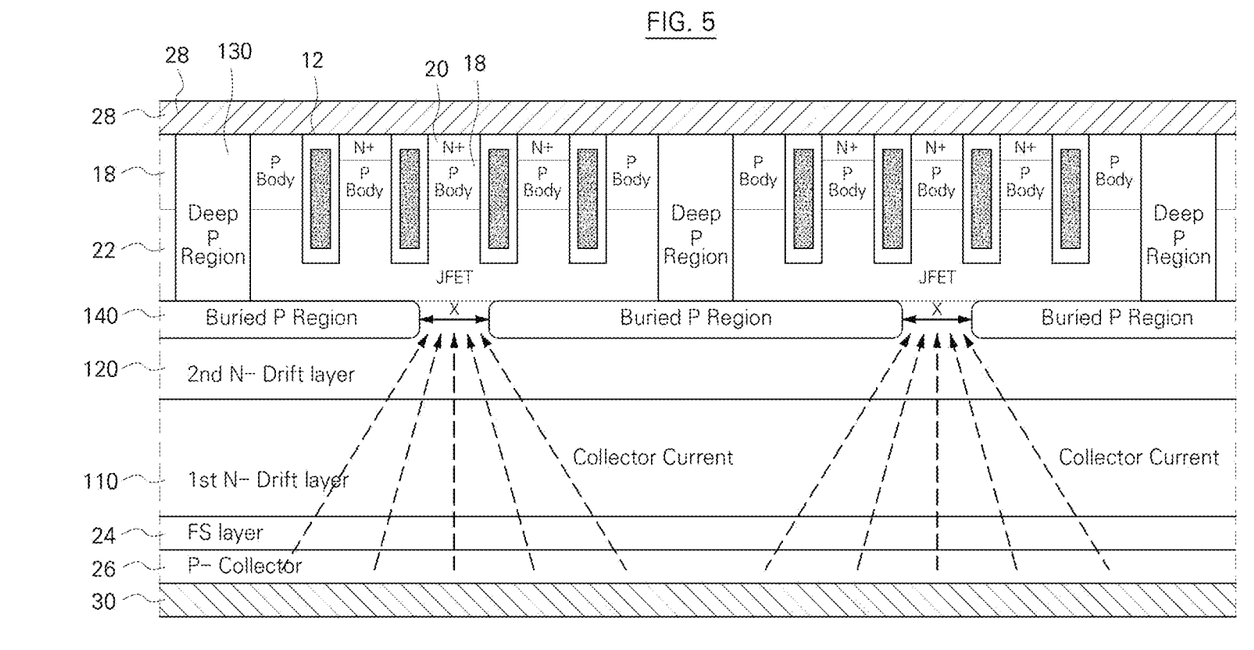
FIG. 5, FIGS. 6A and 6B explain a principle of determining a spacing between buried P regions in the trench gate IGBT according to one embodiment of the present invention.
Figure 6A:
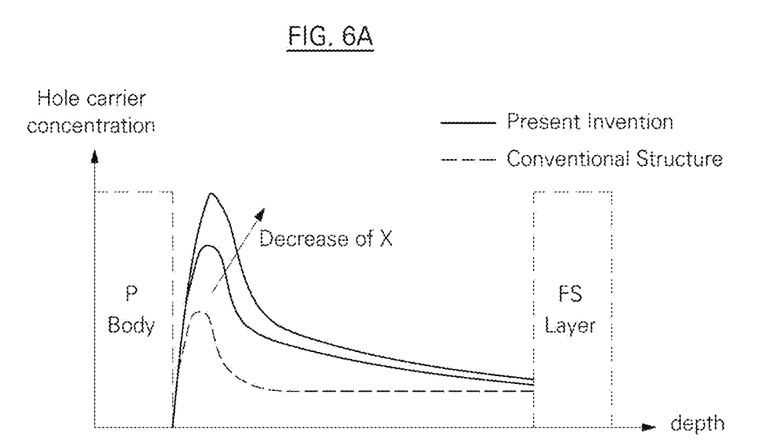
Figure 6B:
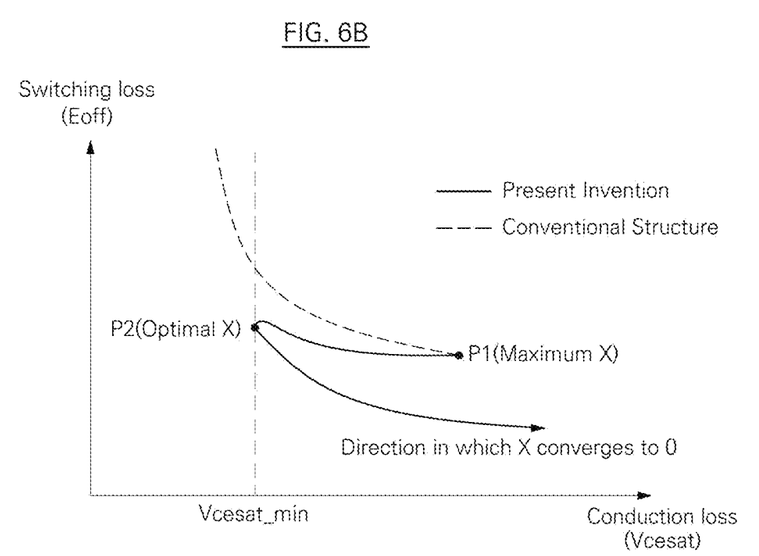

FIG. 2 exemplarily illustrates a cross-sectional view of a trench gate IGBT having a stripe patterned active cell according to one embodiment of the present invention, FIG. 3A through 3F exemplarily illustrate a method of manufacturing the trench gate IGBT according to one embodiment of the present invention, and FIG. 4 is a diagram illustrating a vertical concentration profile of the trench gate IGBT according to one embodiment of the present invention. FIG. 5, FIGS. 6A and 6B explain a principle of determining a spacing between buried P regions in the trench gate IGBT according to one embodiment of the present invention, and FIG. 7 and FIG. 8 explain a tail current reduction mechanism and a switching waveform under an inductive load condition in the trench gate IGBT according to one embodiment of the present invention.

Referring to FIG. 2, the trench gate IGBT may include a first drift region 110 of N− conductivity type, a second drift region 120 of N− conductivity type, a gate trench 12, a gate insulating layer 14, a gate electrode 16, a body region 18 of P conductivity type, an emitter region 20 of N+ conductivity type, a JFET region 22 of N conductivity type, a field stop region 24, a collector region 26 of P conductivity type, an emitter electrode 28, a collector electrode 30, a deep ion region 130 of P conductivity type, and a buried ion region 140 of P conductivity type. Hereinafter, for convenience of description, the deep ion region 130 of P conductivity type will be referred to as a deep P region 130, and the buried ion region 140 of P conductivity type will be referred to as a buried P region 140.

The second drift region 120 may be epitaxially grown on the first drift region 110, and is formed with the N conductivity type impurity concentration relatively higher than that of the first drift region 110, as will be described later (refer to FIG. 4 showing the concentration profile in the vertical direction of the section A-A' in FIG. 2).

The second drift region 120 may be formed on the first drift region 110 by various methods of forming thin film. For example, it may be formed by various processes such as chemical vapor deposition (CVD), molecular beam epitaxy (MBE), sublimation epitaxy, liquid phase epitaxy, and so on.

In the second drift region 120, the deep P region 130 and the gate trench 12 may be formed to have a predetermined depth, respectively.

In the lateral direction of the power semiconductor device, the deep P regions 130 may be disposed with a predetermined w-ACG (width of active cell group) as a spacing, and a plurality of gate trenches 12 that are spaced apart from each other may be arranged between the deep P regions 130 to form an active cell region.

The gate trench 12 may be formed to a predetermined depth inside the second drift region 120, and the gate insulating layer 14 may be formed on the inner wall of the gate trench 12, and the gate electrode 16 may be buried in the gate trench 12 so as to be insulated by the gate insulating layer 14 from the body region 18, the emitter region 20, and the like.

In the region between the adjacent gate trenches 12, the emitter region 20 may be formed adjacent to the upper surface of the second drift region 120, and the body region 18 may be formed at the bottom of the emitter region 20 to contact the emitter region 20 and with a width so as to contact the walls of the adjacent gate trenches 12. Here, the bottom of the gate trench 12 may be located relatively deep in the second drift region 120 compared to the body region 18.

In the region between the deep P region 130 and the adjacent gate trench 12, the body region 18 may be formed from the upper surface of the second drift region 120 to the same depth as the body region 18 formed in the space between the adjacent gate trenches 12. That is, the emitter region 20 may not be formed adjacent to the deep P region 130.

The deep P region 130 may be formed in the second drift region 120 to be relatively deeper than the bottom of the gate trench 12, and the bottom of the deep P region 130 may be in contact with the buried P region 140 formed by being buried in the second drift region 120 to extend laterally by w-BPR (a width of buried P region), which is a predetermined extension length.

Here, the deep P region 130 and the buried P region 140 may be to have an ion concentration equal to or similar to that of the P conductivity type body regions 18 formed between the gate trenches 12 or between the gate trench 12 and the deep P region 130. For example, they may be formed with a Boron dose in the range of about 1e13 cm$^{-2}$ to 1e14 cm$^{-2}$.

The buried P region 140 may be buried in the second drift region 120 relatively deeper than the bottom of the gate trench 12 so as to be spaced apart from the gate trench 12 located thereon.

The region between the body region 18 and the buried P region 140 may be formed as the JFET region 22 for improving conduction characteristics as a charge storage structure.

w_NDL2, which is a critical length of the extension length w-BPR of the buried P region 140 may be defined as the same length as the aforementioned w-ACG. As will be described later, the extension length w-BPR of the buried P region 140 may be determined to be a certain value greater than 0 and less than w_NDL2 so that the loss of the trench gate IGBT can be minimized.

FIG. 2 illustrates a structure in which the bottom of the deep P region 130 is in contact with the center of the buried P region 140 so that the deep P region 130 and the buried P region 140 form a symmetrical T shape. However, it should be understood that that the deep P region 130 and the buried P region 140 may be in contact with each other to form an L-shape or an asymmetric T-shape.

Hereinafter, a manufacturing process of the trench gate IGBT according to one embodiment will be briefly described with reference to FIG. 3A through 3F.

First, as shown in FIG. 3A, after epitaxially growing a portion of the second drift region 120 to a predetermined thickness on the first drift region 110, the P conductivity type ion may be implanted into a predetermined region of the partially grown second drift 120 (namely, a region to be the buried P region 140).

Subsequently, as shown in FIG. 3B, the remainder of the second drift region 120 is additionally epitaxially grown. In this process, the buried P region 140 may be formed in the second drift region 120 by the P conductivity type ions implanted into the second drift region 120 in FIG. 3A. A diffusion process may be further performed to form the buried P region 140.

The buried P region 140 may be formed to have the ion concentration equal to or similar to that of the deep P region 130 and the body region 18 of the P conductivity type, which will be described later.

As shown in FIGS. 3A and 3B, in the process of forming the second drift region 120, by forming the buried P region 140 in the second drift region 120, the concentration of N conductivity type ions in the second drift region 120 may be increased as much as the P-charge Qp increased by the buried P region 140 of the second drift region 120 without degradation of breakdown voltage characteristics (see FIG. 4).

Specifically, the P-charge Qp increased in the second drift region 120 due to the formation of the buried P region 140 may be calculated as "q×Na×w-BPR×d_BPR". Where, q is an amount of charge, Na is the ion concentration of the buried P region 140, w-BPR is the extension length of the buried P region 140 (see FIG. 2), and d_BPR is a thickness of the buried P region 140 (see FIG. 2).

In this regard, an N-charge Qn capable of increasing the ion concentration of the second drift region 120 relatively higher than that of the first drift region 110 may be calculated as "q×(Nd2−Nd1)×w_NDL2×d_NDL2". Where, Nd2 is the ion concentration of the second drift region 120, and Nd1 is the ion concentration of the first drift region 110. w_NDL2 is the critical length of the extension length w-BPR of the buried P region 140 and is equal to w-ACG (see FIG. 2), and d_NDL2 is the thickness of the second drift region 120 (see FIG. 2).

As described above, by the principle of charge balance, the second drift region 120 of which N-charge Qn is increased in proportion with the increase of P-charge Qp in the second drift region 120 caused by the buried P regions 140 may be formed by epitaxially growing on the first drift region 110.

That is, in the breakdown voltage mode, by balancing the total amount of positive ions and the total amount of negative ions so that the PN junction is fully depleted, it may be advantageous that the second drift region 120 can be formed with the higher ion concentration while the substantially same breakdown voltage can be achieved.

In addition, by forming the second drift region 120 with the higher ion concentration, it may be advantageous of improving the dV/dt slope during the switching operation.

Then, as shown in FIG. 3C, by implanting and diffusing P conductivity type ions into the predetermined region of the second drift region 120, the deep P region 130 extending from the upper surface of the second drift region 120 to the buried P region 140 may be formed.

Next, as shown in FIG. 3D, by implanting and diffusing N conductivity type ions into regions other than the deep P region 130 in the second drift region 120, the JFET region 22 may be formed. The JFET region 22 may be formed to have a relatively high ion concentration compared to the second drift region 120.

As shown in FIG. 4, due to the higher ion concentration of the second drift region 120, the JFET region 22 may be formed with a high ion concentration without a decrease in breakdown voltage, as compared with the JFET region of a power semiconductor device according to the conventional art. Accordingly, it may be advantageous that the carrier stored effect can be maximized.

In the power semiconductor device according to one embodiment, the JFET region 22 is not essential and may not be formed.

Subsequently, as shown in FIG. 3E, in order to form the active cell, P conductivity type ions may be implanted and diffused into the upper region of the JFET region 22 to form the body region 18 of P conductivity type.

Subsequently, as illustrated in FIG. 3F, subsequent processes such as etching the gate trench 12, forming the gate insulating layer 14, burying the gate electrode 16, and forming the emitter region 20 of N+ conductivity type may be carried out.

By the principle of charge balance, the buried P region 140 allowing the second drift region 120 to be formed with the increased ion concentration may be disposed to be spaced apart from each other by a predetermined separation value X within the second drift region 120 as shown in FIG. 5.

When the trench gate IGBT conducts, a collector current flows through a spacing region equal to the separation value, and as the separation value X becomes smaller, the cross-sectional area of the current path is reduced and the separation value X gets smaller than a certain value, the on-resistance rapidly increases.

That is, the concentration distribution of carriers accumulated in the second drift region 120 is changed according to the spacing of the buried P region, and the separation value X may be determined in consideration of the trade-off relationship between the conduction loss Vcesat and the switching loss Eoff.

As shown in FIG. 6A, as the separation value X between the buried P regions 140 becomes smaller, it can be shown that the hole carrier concentration in the lower portion of the body region 18 of the second drift region 120 increases.

As shown in FIG. 6B, as the separation value X decreases from the maximum value (i.e., in the case where the buried P region 140 does not exist as in the conventional power semiconductor device, P1), the concentration of holes injected from the collector during conduction increases (carrier stored effect), and thus conduction loss Vcesat also decreases.

The conduction loss Vcesat is also decreased due to the gradual decrease of the separation value X (i.e., the gradual increase of extension length w-BPR of the buried P region 140), and the minimum conduction loss Vcesat_min is shown at the optimal separation value X_opt (P2 in FIG. 6B). When the separation value X decreases more than the optimal separation value X_opt, the hole carrier concentration increases, but the conduction loss Vcesat sharply increases again due to the decrease in the cross-sectional area of the current path.

The optimal separation value X_opt may be selected as any value between 25% and 75% of w-ACG, and the optimal separation value can be determined through repeated adjustments of the separation value and measurement of conduction loss.

As described above, by arranging the buried P regions 140 spaced from each other by the optimal separation value X_opt, the trench gate IGBT having the minimum conduction loss Vcesat may be implemented.

Figure 7:
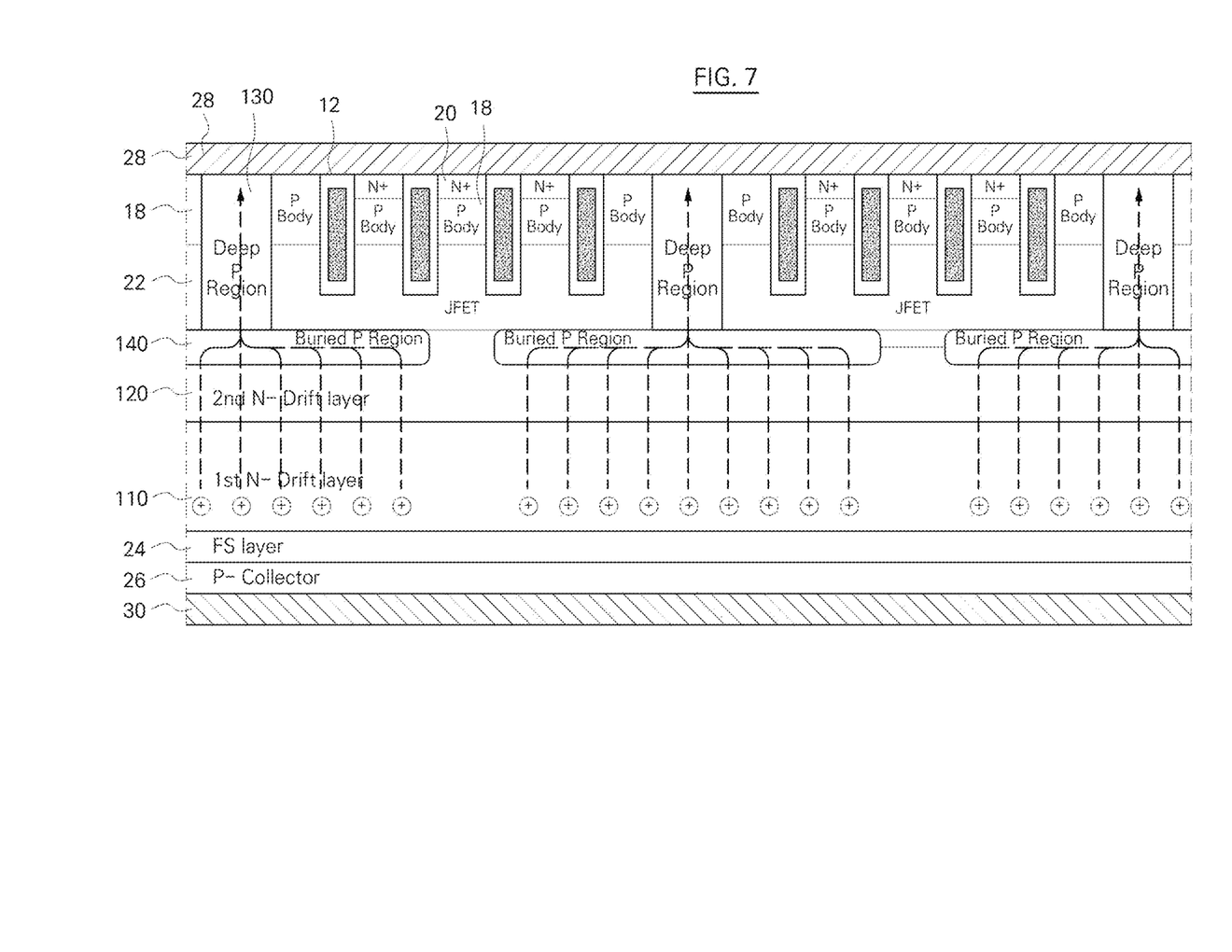
FIG. 7 and FIG. 8 explain a tail current reduction mechanism and a switching waveform under an inductive load condition in the trench gate IGBT according to one embodiment of the present invention.
Figure 8:
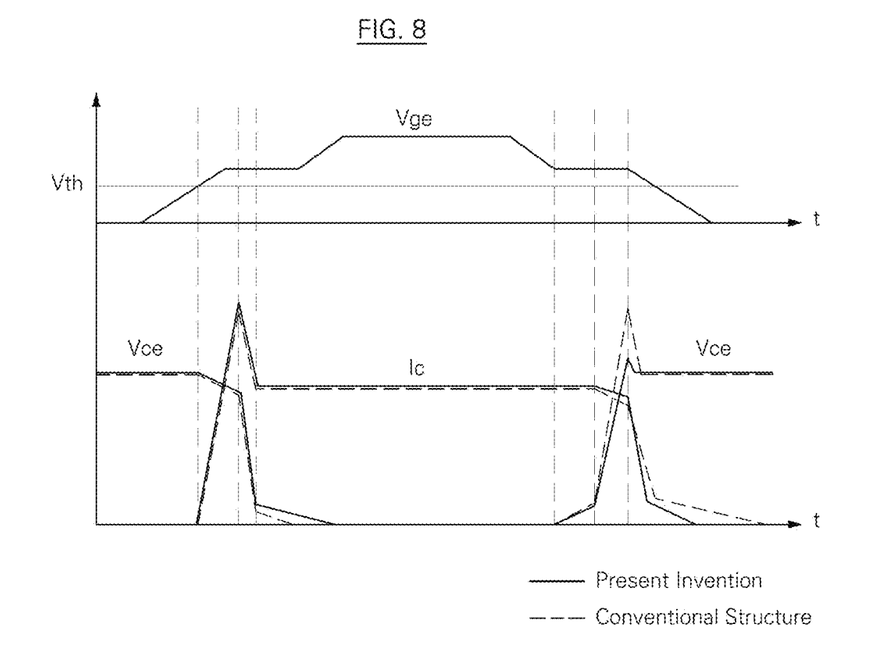

In addition, by disposing the buried P regions 140 extending laterally and buried in the second drift region 120 with the predetermined separation value X, as shown in FIGS. 7 and 8, the deep P region 130 shorted to the emitter electrode 28 and the buried P region 140 in contact with the bottom of the deep P region 130 may function as a path for hole carriers to move when the IGBT is turned off.

Through this, the switching-off characteristics of the trench gate IGBT can be improved, which has an advantage in that the dV/dt slope is improved and the tail current during turn-off is reduced.

Although the above has been described with reference to the embodiments of the present invention, those of ordinary skill in the art can variously modify the present invention without departing from the spirit and scope of the present invention described in the claims below.

What is claimed is:

1. A power semiconductor device, comprising:
a first drift region of a first conductivity type;
a second drift region of the first conductivity type formed by epitaxially growing on the first drift region;
a plurality of buried ion regions of a second conductivity type formed to be buried in the second drift region, wherein the plurality of buried ion regions result in increasing an amount of ions of the second conductivity type in the second drift region;
a plurality of deep ion regions of the second conductivity type, extending from an upper surface of the second drift region to be in contact with the plurality of buried ion regions, respectively, and being spaced apart from each other by a predetermined width of an active cell group in the lateral direction, wherein the plurality of deep ion regions are shorted to an emitter electrode;
wherein each of the plurality of buried ion regions is formed with a predetermined extension length in a lateral direction extending laterally from at least one side of a respective one of the plurality of deep ion regions, and is disposed to be spaced apart from an adjacent one of the plurality of buried ion regions in the lateral direction by a predetermined separation value,
wherein the second drift region is epitaxially grown with a relatively higher ion concentration than that of the first drift region by the increased amount of ions of the second conductivity type caused by the plurality of buried ion regions;
a plurality of gate trenches being spaced apart from each other between adjacent ones of the deep ion regions and being formed from the upper surface of the second drift region to a depth not in contact with the plurality of buried ion regions; and
a body region of the second conductivity type being formed in a region between adjacent ones of the plurality of gate trenches and a region between the plurality of gate trenches and the plurality of deep ion regions.

2. The power semiconductor device of claim 1 further comprising:
an emitter region of the first conductivity type being formed on the body region to be in contact with facing walls of the adjacent ones of the plurality of gate trenches.

3. The power semiconductor device of claim 2, wherein an ion implantation dose of the second conductivity for forming the plurality of buried ion regions, the plurality of deep ion regions and the body region is in a range of 1e13 cm$^{-2}$ to 1e14/cm$^{-2}$.

4. The power semiconductor device of claim 2 further comprising a JFET region of the first conductivity being formed in a region between the body region and the plurality of buried ion regions,
wherein the JFET region is formed to have a higher ion concentration than that of the second drift region.

5. The power semiconductor device of claim 1, wherein the ion concentration of the second drift region is determined to be relatively higher than the ion concentration of the first drift region by the following Equation:

$$(Nd2-Nd1) \times w\_NDL2 \times d\_NDL2 = Na \times w\text{-}BPR \times d\_BPR$$

wherein Nd2 is the ion concentration of the second drift region, Nd1 is the ion concentration of the first drift region, w_NDL2 is equal to the predetermined width of the active cell group w-ACG, d_NDL2 is a thickness of the second drift region, Na is an ion concentration of the buried ion regions, w-BPR is the extension length of the buried ion regions, and d_BPR is a thickness of the plurality of buried ion regions.

6. The power semiconductor device of claim 1, wherein the separation between each of the plurality of buried ion regions is determined as any value between 25% and 75% of the predetermined width of active cell group width.

7. The power semiconductor device of claim 6, wherein the separation value of the plurality of buried ion regions is determined as a value representing a smallest conduction loss value in a curve of showing change of a conduction loss value according to a change in the separation value.

* * * * *